(12) United States Patent
Soenen et al.

(10) Patent No.: US 8,299,946 B2
(45) Date of Patent: Oct. 30, 2012

(54) NOISE SHAPING FOR DIGITAL PULSE-WIDTH MODULATORS

(75) Inventors: Eric Soenen, Austin, TX (US); Alan Roth, Leander, TX (US); Martin Kinyua, Austin, TX (US); Justin Shi, Austin, TX (US); Justin Gaither, Austin, TX (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 32 days.

(21) Appl. No.: 12/959,869

(22) Filed: Dec. 3, 2010

(65) Prior Publication Data
US 2011/0187566 A1 Aug. 4, 2011

Related U.S. Application Data

(60) Provisional application No. 61/300,897, filed on Feb. 3, 2010.

(51) Int. Cl.
*H03M 3/00* (2006.01)
(52) U.S. Cl. ............... 341/143; 341/144; 341/152
(58) Field of Classification Search .......... 341/143, 341/144, 152
See application file for complete search history.

(56) References Cited

U.S. PATENT DOCUMENTS 6,300,891 B1 * 10/2001 Tani et al. .................. 341/144
6,933,872 B2 * 8/2005 Kranz ........................ 341/144
6,965,335 B1 * 11/2005 Trotter et al. .............. 341/152
7,239,257 B1 * 7/2007 Alexander et al. ......... 341/138

OTHER PUBLICATIONS

Lu, Zhengyu et al., "Reduction of Digital PWM Limit Ring with Novel Control Algorithm", Zhejiang University, Hangzhou 310024, P. R. China, IEEE 2001, pp. 521-525.
Qiu, Yang, et al., "Proposed DPWM Scheme with Improved Resolution for Switching Power Converters", Center for Power Electronics Systems, Virginia Polytechnic Institute and State University, Blacksburg, VA, IEEE 2007, pp. 1588-1593.
Peng, Hao, et al., "Modeling of Quantization Effects in Digitally Controlled DC-DC Converters", IEEE Transactions on Power Electronics, vol. 22, No. 1, Jan. 2007, pp. 208-215.
Peterchev, Angel V., et al., "Architecture and IC Implementation of a Digital VRM Controller", IEEE Transactions on Power Electronics, vol. 18, No. 1, Jan. 2003, pp. 356-364.
Dancy, Abram P., et al., "Ultra Low Power Control Circuits for PWM Converters", Department of Electrical Engineering and Computer Science, Massachusetts Institute of Technology, Cambridge, MA, IEEE 1997, pp. 21-27.

* cited by examiner

*Primary Examiner* — Jean B Jeanglaude
(74) *Attorney, Agent, or Firm* — Lowe Hauptman Ham & Berner, LLP

(57) ABSTRACT

A noise shaper that compares an input signal to a feedback output signal, which is a truncated version of the input signal, and generates the difference between the two signals (i.e., the error). The noise shaper then integrates the errors by adding to the error multiple of its delayed versions, and quantizes the integrated errors in such a way that the spectrum of the quantization noise is shaped toward high frequencies to be removed by a LC low-pass filter used in conjunction with the noise shaper. The low frequency content of the desired signal is mostly unaffected.

20 Claims, 3 Drawing Sheets

NOISE SHAPING FOR DIGITAL PULSE-WIDTH MODULATORS

CROSS-REFERENCE TO RELATED APPLICATIONS

The present application claims priority of U.S. Provisional Patent Application Ser. No. 61/300,897, filed on Feb. 3, 2010, which is incorporated herein by reference in its entirety.

FIELD

Embodiments of the present disclosure are generally related to digital signal processing, and more particular to noise shaping for digital pulse-width modulators.

BACKGROUND

Switching power converters are increasingly used in place of analog power amplifiers in high efficiency applications, including, for example, DC-to-DC converters (e.g., voltage regulators), class D power amplifiers, etc. These converters produce a Pulse Width Modulated (PWM) output signal, which generally drives an external inductor and capacitor, and require a feedback loop to adjust the duty cycle of the PWM signal and to control the output voltage or current. Digital instead of analog feedback loops are increasingly used, but in many applications they create "tones," or "limit cycle oscillations," which is undesirable. For example, in an application, the PWM drives a low pass filter, and the feedback loop monitors the output of the low pass filter, and adjusts the duty cycle of the PWM signal in order to obtain the desired output voltage. In response to the error signal (e.g., the difference between the desired voltage and the actual output voltage) the digital filter generates a value that in conjunction with an ADC (analog-to-digital converter) controls the digital PWM DAC (digital-to-analog converter). In systems where the digital PWM generator is clocked at a frequency that is a multiple of the PWM update rate, the accuracy of the PWM DAC is limited to the ratio of the clock rate to the update rate, which is typically 16 to 256 for 4 to 8 bits of resolution. The limited DAC resolution then limits the ability of the digital filter to correct the output voltage. As a result, the control loop toggles the output of the PWM DAC between several values, which shows up as quantization noise, "tones," or "limit cycle oscillations," and tends to get concentrated at specific frequencies (e.g., the passband of the frequency response of the control loop), which is undesirable.

BRIEF DESCRIPTION OF THE DRAWINGS

The details of one or more embodiments are set forth in the accompanying drawings and the description below. Other features, characteristics, and advantages of the embodiments will be apparent from the description, drawings, and claims.

Like reference symbols in the various drawings indicate like elements.

DETAILED DESCRIPTION

Figure 1:
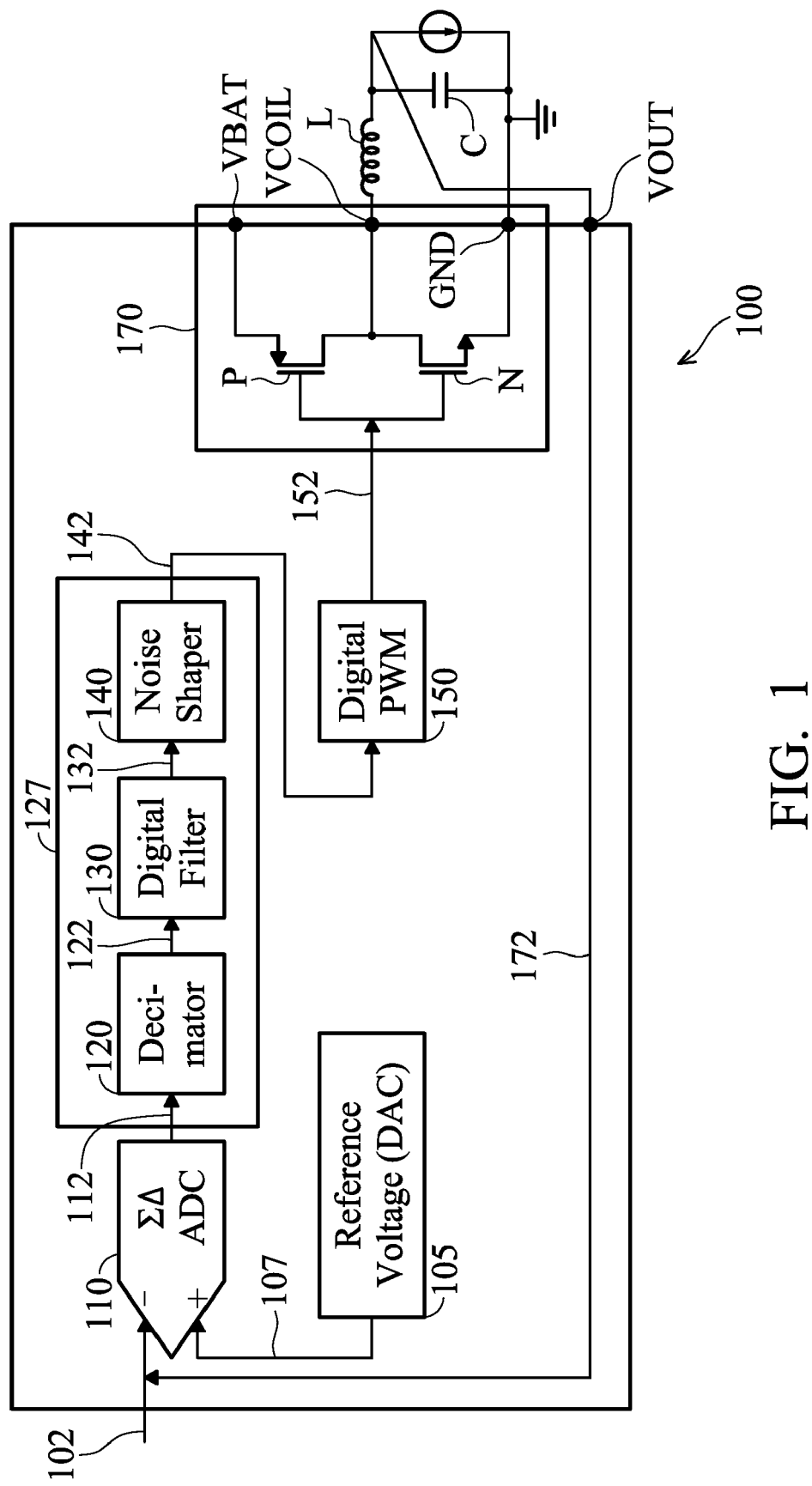
FIG. 1 is a diagram of an exemplary control loop used in a switching amplifier, in accordance with some embodiments.

Embodiments, or examples, illustrated in the drawings are described below using specific language. It will nevertheless be understood that the embodiments and examples are not intended to be limiting. Any alterations and modifications in the disclosed embodiments, and any further applications of principles disclosed in this document are contemplated as would normally occur to one of ordinary skill in the pertinent art. Reference numbers may be repeated throughout the embodiments, but this does not necessarily require that feature(s) of one embodiment apply to another embodiment, even if they share the same reference number.

Embodiments of the disclosure can have one or a combination of the following features and/or advantages. Various embodiments reduce/eliminate the effects of quantization noise and tonal behavior by shaping their frequency components to high frequencies and out of the frequency band of interest, but keep the desired low frequency of the control loop mostly unaffected. As a result, the embodiments reduce the prevalence of low frequency tones, and improve the noise performance for the overall system using such embodiments.

Exemplary Circuit

FIG. 1 is a diagram of a control loop (e.g., circuit) 100 in accordance with some embodiments. Control loop 100 is commonly used in a power amplifier, a switching amplifier, a class-D amplifier, a DC-DC converter, etc. Control loop 100 provides a closed loop system and adjusts the output voltage by comparing it to the input (or reference) voltage.

DAC 105 provides a DC reference voltage on line 107 for use by sigma-delta ADC 110. In some embodiments, this reference voltage 107 is programmable.

Sigma-delta ADC (Sigma-delta Analog to Digital Converter) 110 converts the signal 102 from analog to digital on line 112, taking account of the reference voltage 107 and the feedback signal 172. Sigma-delta ADC 110 is shown for illustration, but other ADCs are within the scope of various embodiments of the disclosure. Sigma-delta ADC 110, as part of the control loop 100, compares the feedback signal of output voltage Vout on line 172 to the DC voltage reference 107 to control output voltage Vout. If voltage Vout on line 172 is too high compared to reference voltage 107, sigma-delta ADC 110 reduces voltage Vout. But if voltage Vout is too low, sigma-delta 110 increases voltage Vout.

Decimator 120, digital filter 130, and noise shaper 140 can be considered part of a digital processing block 127 because they all process digital signals, i.e., they receive digital input signals and provide digital output signals. Decimator 120 reduces the sampling rate of signal 112, which in various embodiments is 32 samples at a time, resulting in signal 122.

Digital filter 130 controls the frequency response and transfer function of loop 100 by controlling the frequency response of signals 112 and 132.

Noise shaper 140 takes a high-resolution digital code of signal 132 and truncates it into a lower resolution code to form signal 142 that can be processed by digital PWM generator 150. High-resolution code or data corresponds to data having a higher number of bits while low resolution code or data corresponds to data having a lower number of bits. In various embodiments, data 132 includes 10 bits while data 142 includes 5 bits. In reducing the resolution of signal 132, noise shaper 140 shifts quantization noise to frequencies higher than the cut-off frequency of the LC low pass filter to attenuate the quantization noise and therefore increase the overall system performance. In various embodiments, the frequency response of noise shaper 140 is set by the clock rate at which noise shaper 140 runs. If fc represents the clock rate, all quantization noise below fc is attenuated, and is attenuated most at lower frequency. Those of ordinary skill in the art will recognize that the noise spectral density is 0 for DC (e.g., direct current). The roll-off is of the first order wherein a doubling of the frequency corresponds to a doubling of the noise spectral density. In embodiments that use a noise shaper 140 having a higher order, a doubling of the frequency corresponds to more than a doubling of the noise spectral density. In various embodiments, the clock rate of a first order noise shaper 140 (which is also the clock rate of PWM DAC 150) is configured to be many times (e.g., a factor of 100) the cut-off frequency of the LC filter. In various embodiments of a higher order noise shaper 140, this factor is reduced to about 10.

Digital PWM generator or PWM DAC 150 converts digital data 142 to analog data 152 having pulse width modulated information to drive the switching stage comprising transistors P and N. Digital PWM generator 150 drives the switching stage to a respective high or low level based on the period of the portion of data 152 that is at a high or low level. In various embodiments, digital PWM generator 150 has a resolution of 5 bits providing 32 corresponding values on line 152.

Transistors N and P form the driving or output stage 170.

Vbat in some embodiments is the battery voltage of, for example, a cellular phone using loop 100.

The LC circuit comprising inductor L and capacitor C low pass filters voltage Vcoil, which is controlled by signal 152. In various embodiments, the quantization noise is shaped above the cut-off frequency of the LC circuit, which is then filtered (e.g., removed) by this LC circuit. Further, the value of inductor L and capacitor C is chosen so that a DC-DC converter (not shown) using the control loop 100 has a desired dynamic performance. That is, the LC cut-off frequency is low enough compared to the switching frequency of the DC-DC converter. If f represents the cut-off frequency, where it is the circular constant.

In various embodiments, signals 102, 112, 122, and 132 include 10 bits while signal 142 includes 5 bits. Signals 102, 107, 152, and 172 are analog while signals 112, 122, 132, 142 are digital. Sigma-delta ADC 110 runs at 100 MHz, digital filter 130 and noise shaper 140 runs at ~3.3 MHz. Digital PWM generator 150 uses a clock running at 100 MHz, and counts pulses that are equal to the number of bits of signal 132 (e.g., the output of digital filter 130). As a result, signal 112 is at 100 MHz; signal 122 is at 100 MHz/32 (~3.3 MHz) where 32 is the number of samples run by decimator 120; signal 132 is at ~3.3 MHz; signal 142 is at ~3.3 MHz; signal 152 is at ~3.3 MHz.

The Noise Shaper—Some Embodiments

Figure 2:
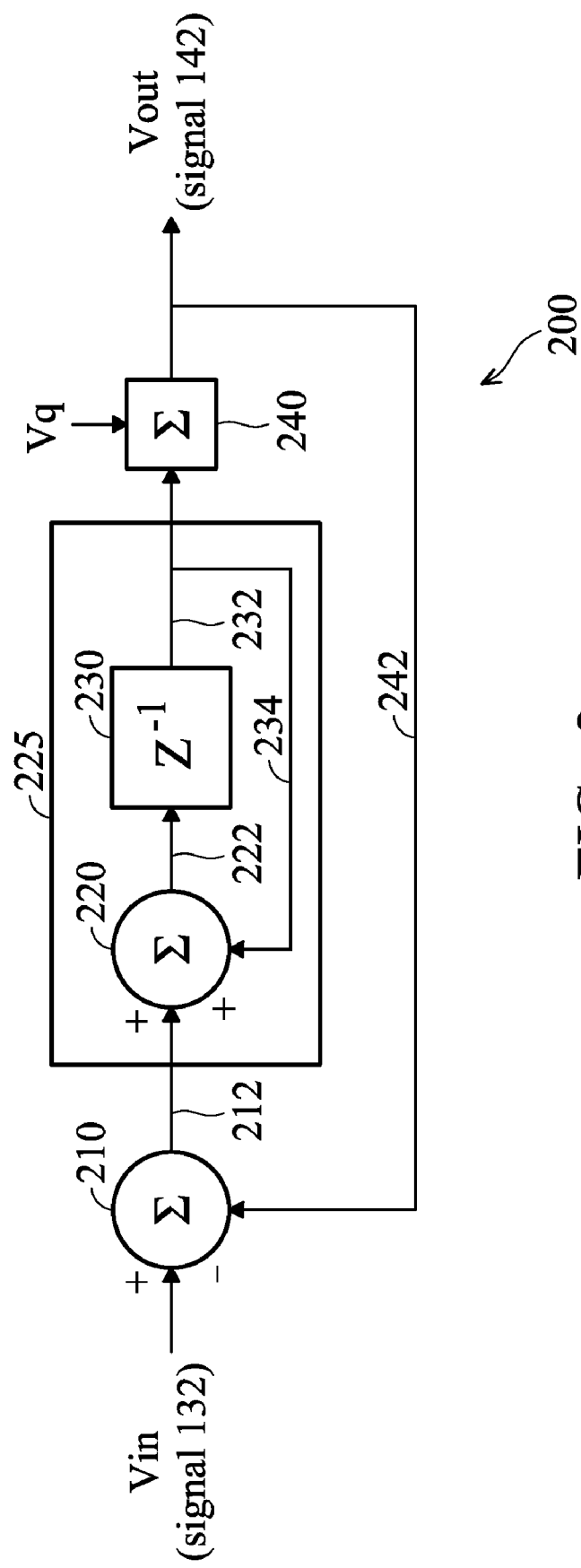
FIG. 2 is a block representing the noise shaper in the control loop in FIG. 1 in the Z domain, in accordance with some embodiments.

FIG. 2 is a block 200 representing noise shaper 140 in the Z domain, in accordance with some embodiments.

In each clock cycle, summation block 210 compares the input signal 132 to a feedback output 242, generates the difference (or quantization error) between signals 132 and 242, and provides a signal 212. A signal 212 is signal 132 being added to or subtracted from a signal 242, which is signal 142 truncated from signal 132 and fed back to summation block 210. Stated another way, each clock cycle, summation block 210 adds a new signal 242 to a previous sum of summation block 210 and creates a new sum represented by signal 212. Summation block 210 thus continuously adds multiple versions of signal 242 to signal 132.

Integration block 225 via summation block 220 and delay block 230 takes signal 212 and adds a delayed version of the same signal 212 onto itself multiple times, as illustrated by the feedback signal 234 of signal 232 to summation block 220. Each clock cycle, summation block 220 adds a signal 234 to signal 212 to provide a signal 222. Stated differently, at each clock cycle, summation block 220 adds a new value of signal 232 (i.e., signal 234) to the previous sum of summation block 220 and creates a new sum represented by signal 222. Summation block 220 thus continuously adds multiple versions of signals 234 to signal 212. The symbol $z^{-1}$ in delay block 230 represents a time delay or cycle of digital filter 130, which can be implemented by various mechanisms, including, for example, a flip-flop. Each clock cycle delay block 230 delays a signal 222 to form a signal 232. Signals 222 and 232 are therefore the same except for the time (or phase) delay. Each time signal 232 is generated it is fed back as signal 234 to summation block 220.

If voltage $V_{212}$ represents signal 212, the input of integration block 225, and voltage $V_{232}$ represents signal 232, the output of integration block 225, then voltages $V_{212}$ and $V_{232}$ are mathematically related as follows:

$$V_{232} = (V_{212} + V_{232})z^{-1}$$

or $$V_{232} = (1 - z^{-1}) = V_{212}z^{-1}$$

or $$V_{232} = V_{212}\frac{z^{-1}}{1 - z^{-1}}$$

As a result, integration block 225 may be represented by $$\frac{z^{-1}}{1 - z^{-1}}$$

which, as those of ordinary skill in the art will recognize, is an integrator.

Summation block 240 quantizes signal 232. Summation block 240 truncates or cuts off the least significant bits of signal 232. Stated in the signal processing art, summation block 240 adds quantization error (i.e., truncation error or quantization noise) Vq to signal 232 because when summation block 240 cuts off (e.g., truncates) the least significant bits of signal 232 summation block 240 introduces quantization error Vq. In various embodiments, summation block 240 truncates the least significant five bits of signal 232, converting signal 232 having 12 bits to 5 bits. The number of bits (e.g., 12) of signal 232 is from the number of bits (e.g., 10) from signal 132, which passes through summation block 220 and increases from 10 to 12 resulting in signal 222. Signal 232 includes the same number of 12 bits from signal 222 as delay block 230 does not change the number of bits of signal 222. For example, signal 132 includes a value of 5.5 represented by 5 bits for the integer and another 5 bits for the fraction 0.5. After the operation of summation blocks 210, 220, 230, and 240, voltage 142 results in a value of 5, which has been truncated from 5.5 of signal 132.

Mathematically, voltages Vin and Vout (or signals 132 and 142 as applied to FIG. 1) are related as follows:

$$(Vin - Vout)\frac{z^{-1}}{1 - z^{-1}} + Vq = Vout$$

$$Vout\left(1 + \frac{z^{-1}}{1-z^{-1}}\right) = Vin\frac{z^{-1}}{1-z^{-1}} + Vq$$

$$Vout = Vin\, z^{-1} + Vq(1-z^{-1})$$

In the above mathematical relation, voltage Vout comprises a first component related to voltage Vin (e.g., Vin $z^{-1}$) and a second component related to quantization noise Vq (e.g., Vq $(1-z^{-1})$). The term $z^{-1}$ in the first component indicates that signal Vin is delayed, while the term $1-z^{-1}$ indicates that the quantization noise Vq includes a high pass filter or includes high frequency components, which will be filtered by the LC low pass filter in FIG. 1. As can be seen, the quantization noise is shaped towards the high frequencies or bands that are not of interest. In the above illustration, only one delay (e.g., $z^{-1}$) is used, and the high pass filter is a first order. In embodiments where a number of delays and a higher order noise shaper are used, Vout and Vin are related as follows:

$$Vout = Vin\, z^{-n1} + Vq(1-z^{-1})^{n2}$$

where n1 and n2 are integer numbers, n1 represents the number of delays experienced by voltage Vin, and n2 represents the order of the high pass filter or of the noise shaper because an nth order noise shaper means a noise shaper with an nth order high-pass filter characteristic.

The Noise Shaper—Some Further Embodiments

Figure 3:
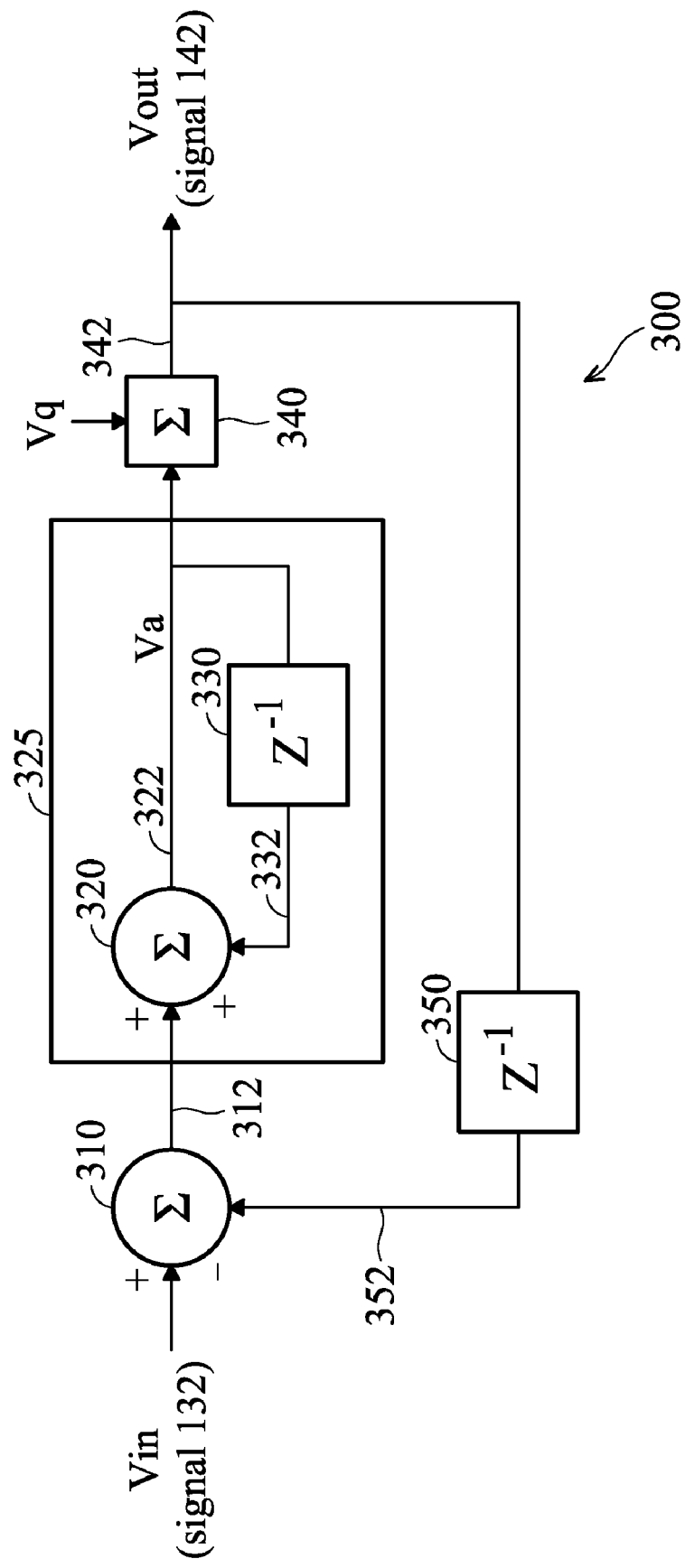
FIG. 3 is a block representing the noise shaper in the control loop in FIG. 1 in the Z domain, in accordance with some further embodiments.

FIG. 3 shows a block 300 representing noise shaper 140 in the Z domain, in accordance with some further embodiments.

In each clock cycle summation block 310 adds (or subtracts) a signal 352 to (or from) signal 132 and provides a signal 312, which is the error between signals 132 and 352. Signal 352 is output signal 342 delayed by delay block 350. Summation block 310 thus integrates (e.g., accumulates) the errors between signals 352 and 132.

Integrator block 325 includes summation block 320 and delay block 330. Summation block 320 in each clock cycle adds a signal 332 to a previous sum of summation block 320, and provides a new signal 322 (or voltage Va). Each signal 332 is a signal 322 delayed by delay block 330. Compared to integrator block 225, integrator block 225 provides the integrator output (e.g., signal 232) after the summation block 220 and the delay block 230, while integrator block 325 provides the integrator output (e.g., signal 322) after summation block 320 and before the delay block 330.

If voltage $V_{312}$ represents signal 312, the input of integration block 325, and voltage $V_{322}$ represents signal 322, the output of integration block 325, then voltages $V_{312}$ and $V_{322}$ are mathematically related as follows:

$$V_{322} = V_{312} + V_{332}z^{-1}$$

or $$V_{322} = (1-z^{-1}) = V_{312}$$

or $$V_{322} = V_{312}\frac{1}{1-z^{-1}}$$

As a result, integration block 325 can be represented by $$\frac{1}{1-z^{-1}}$$

Similar to summation block 240 truncating signal 232, summation block 340 truncates or cuts off the least significant bits of signal 322. Stated in the signal processing art, summation block 340 adds quantization error Vq to signal 322. As a result, summation block 340 truncates the quantization noise.

Delay block 350 provides signal 352 as a delay of signal 342 to summation block 310.

Mathematically, voltages Vin and Vout (or signals 132 and 142 as applied to FIG. 1) are related as follows:

$$Va = z^{-1}Va + Vin - z^{-1}Vout$$

$$Vout = Va + Vq$$

$$Vout = z^{-1}Va + Vin - z^{-1}Vout + Vq$$

$$Vout = Vin + Vq - z^{-1}(Vout - Va)$$

$$Vout = Vin + (1-z^{-1})Vq$$

In the above mathematical relation, voltage Vout comprises a first component related to voltage Vin and a second component related to quantization noise Vq (e.g., Vq$(1-z^{-1})$). The term $1-z^{-1}$ indicates that the quantization noise Vq includes a high pass filter or includes high frequency components, which will be filtered by the LC low pass filter in FIG. 1. Stated another way, the quantization noise is shaped towards the high frequencies or bands that are not of interest.

$$Vout = Vin\, z^{-n1} + Vq(1-z^{-1})^{n2}$$

In the above illustration, the high pass filter is a first order filter. In embodiments where a higher order noise shaper is used, voltage Vout and voltage Vin are related as follows $$Vout = Vin + Vq(1-z^{-1})^{n2}$$

Where n2 represents the order of the high pass filter or of the noise shaper.

A number of embodiments have been described. It will nevertheless be understood that various modifications may be made without departing from the spirit and scope of various embodiments. For example, various summation blocks disclosed above can be implemented by various mechanisms, and various embodiments are not limited to a particular mechanism. Similarly, various embodiments are not limited to any implementation of a delay block, but are applicable to various implementations, including, for example, using a D flip-flop. FIGS. 2 and 3 show $1^{st}$ order noise shaper 200 and 300 represented by delay element $z^{-1}$, but the embodiments are also applicable to higher order noise shapers, i.e., those that include multiple delay elements, so that quantization noise can be pushed to even higher frequencies. Some embodiments are used in DC-DC, AC-DC, DC-AC converters, class D (switching) power amplifiers and motor controllers. Some embodiments are used in circuits that include a PWM output and where the PWM signal is generated digitally in such a way that discrete time increments are possible. Generally, various embodiments are used in a way similar to those in the disclosed embodiments by placing a noise shaper between a digital filter and a digital PWM generator. The noise shaper is used to truncate the higher bit resolution of the digital filter to the lower resolution of the PWM generator.

What is claimed is:

1. A circuit comprising:
   an ADC configured to receive an analog feedback signal and an analog input signal and generate a digital ADC output;
   a digital filter configured to control a frequency response of the digital ADC output and generate a digital filter output having a first number of bits;
   a noise shaper configured to truncate the first number of bits and generate a noise shaper output having a second number of bits that is less than the first number of bits, and to shape quantization noise generated during truncation; and
   a PWM DAC configured to process the second number of bits of the noise shaper output and generate a PWM DAC output.

2. The circuit of claim 1 further comprising a decimator configured to reduce a sampling rate of the digital ADC output.

3. The circuit of claim 1 further comprising a low pass filter configured to filter high frequencies corresponding to the quantization noise shaped by the noise shaper.

4. The circuit of claim 3 wherein the low pass filter generates the analog feedback signal.

5. The circuit of claim 1 wherein an input Vin and an output Vout of the noise shaper is represented by an equation selected from a group consisting of $$Vout = Vin z^{-n1} + Vq(1-z^{-1})^{n2}$$

and $$Vout = Vin + (1-z^{-1})^{n2} Vq$$

wherein Vq represents the quantization noise generated during truncation; n1 represents a number of delays experienced by Vin, and n2 represents an order of a high pass filter in the noise shaper.

6. The circuit of claim 1 wherein the noise shaper comprises:
   a first summation block configured to process the digital filter output and a truncated version of the digital filter output, and generate a first summation output;
   an integrator configured to process the first summation output and generate an integrator output; and
   a second summation block configured to process the integrator output and the quantization noise generated during truncation, and generate a second summation block output being the noise shaper output and fed back to the first summation block.

7. The circuit of claim 6 wherein the integrator includes:
   a third summation block configured to process the first summation output and the integrator output, and generate a third summation output; and
   a delay block configured to delay the third summation output and generate the integration output, which is fed back to the third summation block.

8. The circuit of claim 6 wherein the integrator output includes a third number of bits that is higher than the first number of bits.

9. The circuit of claim 1 wherein the noise shaper comprises:
   a first summation block configured to process the digital filter output and a delayed version of the noise shaper output, and generate a first summation block output;
   an integrator configured to process the first summation block output and generate an integrator output; and
   a second summation block configured to process the integrator output, the quantization noise, and generate the noise shaper output.

10. The circuit of claim 9 wherein the integrator includes
    a third summation block configured to process the first summation block output and generate a third summation block output that serves as the integrator output;
    a delay block configured to delay the third summation block output and generate a delay block output fed back to the third summation block.

11. The circuit of claim 9 wherein the integrator output includes a third number of bits that is higher than the first number of bits.

12. The circuit of claim 1 wherein the noise shaper generates a third number of bits that is higher than the first number of bits; the third number of bits being truncated to form the second number of bits.

13. The circuit of claim 1 included in a second circuit selected from a group consisting of a DC-DC converter, an AC-DC converter, a DC-AC converter, a switching power amplifier, and a motor controller.

14. A circuit comprising:
    an ADC configured to receive an analog feedback signal and an analog input signal, and generate a digital ADC output;
    a digital filter configured to control a frequency response of the digital ADC output and generate a digital filter output Vin;
    a noise shaper configured to process Vin and generate a noise shaper output Vout based on an equation is selected from a group consisting of $$Vout = Vin z^{-n1} + Vq(1-z^{-1})^{n2}$$

and $$Vout = Vin + (1-z^{-1})^{n2} Vq$$

wherein Vq represents quantization noise generated in the circuit, z represents a time delay, n1 represents a number of delays experienced by Vin, and n2 represents an order of the noise shaper;
    a PWM DAC configured to process the noise shaper output and generate a PWM DAC output; and
    a low pass filter configured to remove high frequencies associated with Vq; an output of the low pass filter including the analog feedback signal.

15. The circuit of claim 14 further comprising a switching stage configured to process the PWM DAC output and generate a switching stage output processed by the low pass filter.

16. The circuit of claim 15 wherein the analog feedback signal includes an output of the low pass filter.

17. The circuit of claim 14 further comprising a decimator configured to process the ADC output and generate a decimator output processed by the digital filter.

18. A circuit comprising:
    an ADC configured to receive an analog feedback signal and generate a digital ADC output;
    a digital filter configured to control a frequency response of the digital ADC output and generate a digital filter output;
    a noise shaper configured to process the digital filter output and generate a noise shaper output;

a PWM DAC configured to process the noise shaper output and generate a PWM DAC output;
a switching stage configured to process the PWM DAC output and generate a switching stage output; and
a low pass filter configured to filter high frequency quantization noise shaped by the noise shaper, and generate the feedback analog signal.

19. The circuit of claim 18 further comprising a node providing a reference voltage to the ADC.

20. The circuit of claim 18 further comprising a decimator configured to process the ADC output.

* * * * *